(12) United States Patent
den Besten (10) Patent No.: US 9,419,515 B2
(45) Date of Patent: Aug. 16, 2016

(54) CHARGE PUMP CIRCUIT

(71) Applicant: NXP B.V., Eindhoven (NL)

(72) Inventor: Gerrit Willem den Besten, Eindhoven (NL)

(73) Assignee: NXP B.V., Eindhoven (NL)

( * ) Notice: Subject to any disclaimer, the term of this patent is extended or adjusted under 35 U.S.C. 154(b) by 193 days.

(21) Appl. No.: 14/201,229

(22) Filed: Mar. 7, 2014

(65) Prior Publication Data

US 2015/0256063 A1 Sep. 10, 2015

(51) Int. Cl.
| | |
|---|---|
| H03L 7/06 | (2006.01) |
| H02M 3/07 | (2006.01) |
| H02M 1/08 | (2006.01) |
| H03L 7/089 | (2006.01) |
| H03K 3/013 | (2006.01) |
| H03L 7/085 | (2006.01) |
| H03L 7/099 | (2006.01) |

(52) U.S. Cl.
CPC ........ *H02M 3/07* (2013.01); *H02M 1/08* (2013.01); *H03K 3/013* (2013.01); *H03L 7/085* (2013.01); *H03L 7/0896* (2013.01); *H03L 7/099* (2013.01)

(58) Field of Classification Search
USPC .......................................................... 327/157
See application file for complete search history.

(56) References Cited

U.S. PATENT DOCUMENTS

| | | | |
|---|---|---|---|
| 5,363,066 A * | 11/1994 | Chen | H03L 7/0898 327/108 |
| 5,920,215 A | 7/1999 | Drost et al. | |
| 6,124,755 A | 9/2000 | Parker et al. | |
| 6,160,723 A * | 12/2000 | Liu | H02M 3/073 327/536 |
| 6,441,660 B1 * | 8/2002 | Ingino, Jr. | H03K 3/0315 327/156 |
| 7,253,798 B2 | 8/2007 | Smeets | |
| 7,977,984 B1 | 7/2011 | D'Souza et al. | |
| 8,362,825 B2 | 1/2013 | Bergler et al. | |
| 8,624,628 B1 * | 1/2014 | Chen | H03K 19/018521 326/80 |

OTHER PUBLICATIONS

Extended European Search Report for EP Patent Appln. No. 15155033.2 (Jul. 22, 2015).

* cited by examiner

*Primary Examiner* — Lincoln Donovan
*Assistant Examiner* — Patrick Chen (57) ABSTRACT

A charge pump circuit is disclosed. The charge pump circuit includes a first circuit powered by a first supply voltage and configured to adjust a voltage of an output in response to first and second sets of control signals. The first circuit includes a set of transistors having respective switching voltages. A control circuit powered by a second voltage, less than the first supply voltage, is configured to generate the first and second sets of control signals. A voltage shifting circuit is configured to bias voltages of the first and second sets of control signals relative to the switching voltages.

18 Claims, 6 Drawing Sheets

CHARGE PUMP CIRCUIT

Charge pumps are utilized in a number of applications for sourcing and/or sinking of charge. Some charge pumps utilize full swing digital signals to open current source switches for sourcing or sinking current to and from an output node. The digital signal control can be used to quickly switch current sources on and off during operation. However, relatively large transients can be induced across parasitic device capacitances that inject unwanted spurious noise and may offset the effectively transferred charge.

Various example embodiments are directed to charge pump circuits and their implementation.

According to an example embodiment, a charge pump circuit includes a first circuit, powered by a first supply voltage, and which is configured and arranged to adjust a voltage of an output in response to first and second sets of control signals. The first circuit includes a set of transistors having respective switching voltages. The charge pump also includes a control circuit powered by a second voltage, which is less than the first supply voltage. The control circuit generates the first set of control signals as a function of a voltage of a first command signal, and generates the second set of control signals as a function of a voltage of a second command signal. The charge pump also includes a voltage shifting circuit configured to bias voltages of the first and second sets of control signals relative to the switching voltages.

In some embodiments, a charge pump circuit includes first and second switching circuits powered from a first supply voltage. The first and second switching circuits are each configured to provide current to a respective output node in response to a first set of control signals, and drain current from the respective output node in response to a second set of control signals. A bias circuit is configured to bias a voltage of the output node of the second switching circuit toward a voltage of the output node of the first switching circuit. The charge pump also includes a control circuit powered by a second voltage, which is less than the first supply voltage. The control circuit is configured to generate the first set of control signals as a function of a voltage of the first control input, and generate the second set of control signals as a function of a voltage of the second control input. A voltage shifting circuit is configured to bias voltages of the first and second sets of control signals as a function of the voltage of the output node of the first switching circuit.

The disclosed charge pump circuits may be applicable to a variety of applications. In some embodiments, a phase-lock-loop (PLL) circuit, including a charge pump circuit, is disclosed. The PLL circuit includes a phase frequency detection circuit configured to provide command signals for adjustment of a frequency of an output signal, based on a comparison of phases of an input signal and a feedback signal. The charge pump circuit is configured to receive the command signals from the phase frequency detection circuit and adjust voltage of a frequency control signal based on the command signals. The charge pump circuit includes a first circuit powered by a first supply voltage and is configured to adjust a voltage of the frequency control signal in response to first and second sets of control signals. The first circuit includes a set of transistors having respective switching threshold parameters. The charge pump circuit also includes a control circuit powered by a second voltage that is less than the first supply voltage. The control circuit is configured to generate the first set of control signals as a function of a voltage of a first one of the command signals, and generate the second set of control signals as a function of a voltage of a second one of the command signals. The charge pump circuit includes a voltage shifting circuit configured to bias voltages of the first and second sets of control signals relative to the switching threshold parameters. The PLL circuit further includes a voltage controlled oscillator having an input coupled to receive the control signal from the charge pump and configured to generate the output signal. The PLL circuit also includes a feedback path configured and arranged to derive the feedback signal from the output signal and provide the feedback signal to the PFD circuit.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods utilizing charge pumps. While not necessarily so limited, various aspects may be appreciated through a discussion of examples using this context.

Various example embodiments are directed to a charge pump circuit including a first adjustment circuit, powered by a first supply voltage, and which is configured and arranged to adjust a voltage of an output in response to first and second sets of control signals. The charge pump also includes a control circuit powered by a second voltage, which is less than the first supply voltage. The control circuit generates the first set of control signals as a function of a voltage of a first command signal, and generates the second set of control signals as a function of a voltage of a second command signal.

The first adjustment circuit includes a set of transistors having respective switching threshold parameters (e.g., threshold source-gate voltages at which a transistor turns on and off). The actual voltages that must be applied to a gate of a transistor to turn it on and off may be referred to as switching voltages herein.

Due to changes in the output voltage (Vout) during operation, switching voltages of the transistors may drift during operation. As a result, the control signals generated by the control circuit may not be accurately aligned with the switching voltages of the transistors driven by the control signals. The charge pump also includes a voltage shifting circuit configured to bias voltages of the first and second sets of control signals relative to the switching voltages. For instance, in some embodiments, the biasing of the first and second sets of control signals centers an operating voltage range of the control signals relative to on and off switching voltages of a respective one of the set of transistors, thereby compensating for drift of the switching voltage.

In some embodiments, the adjustment circuit includes first and second switching circuits powered by the first supply voltage. The first and second switching circuits are each configured to provide current to a respective output node in response to a first set of control signals, and drain current from the respective output node in response to a second set of control signals. In some implementations, a bias circuit (e.g., a unity gain buffer) is configured to bias a voltage of the output node of the second switching circuit toward a voltage of the output node of the first switching circuit. In some implementations, the first and second switching circuits are configured to perform complementary switching operations. In some embodiments, each of the first and second switching circuits includes a plurality of transistors, each transistor having a gate driven by a respective one of the first and second sets of control signals via a voltage shifting circuit. The voltage shifting circuit may bias different ones of the transistors of the first and second switching circuits with different bias voltages. In some implementations, for each of the plurality of transistors that is an n-type transistor, the voltage shifting circuit increases a voltage of the corresponding control signal by an amount equal to the voltage of the output, added to an off gate-source switching voltage of the transistor. Similarly, for each of the plurality of transistors that is a p-type transistor, the voltage shifting circuit may increase a voltage of the corresponding control signal used to drive the gate of the transistor by an amount equal to the voltage of the output, less the second voltage and less the off source-gate switching voltage of the transistor.

In some embodiments, the first and second switching circuits each include one or more transistors having threshold switching voltages that drift in response to changes in the voltage of the respective output node. For instance, changes to an output node voltage in the first and second switching circuits will change the threshold switching voltage of the transistor with respect to the control signal reference. In some implementations, the voltage shifting circuit is configured to bias voltages of the sets of control signals to track with the migration of threshold switching voltages of corresponding transistors driven by the control signals.

The disclosed charge pump circuits may be applicable to a variety of applications. As one non-limiting example, a PLL circuit may be implemented with a charge pump circuit. The PLL circuit includes a phase frequency detection circuit configured to provide command signals for adjustment of a frequency of an output signal based on a comparison of phases of an input signal and a feedback signal. The charge pump circuit is configured to receive the command signals from the phase frequency detection circuit and adjust the voltage of a frequency control signal based on the command signals. The PLL further includes a voltage controlled oscillator having an input coupled to receive the frequency control signal from the charge pump and configured to generate the output signal.

Figure 1:
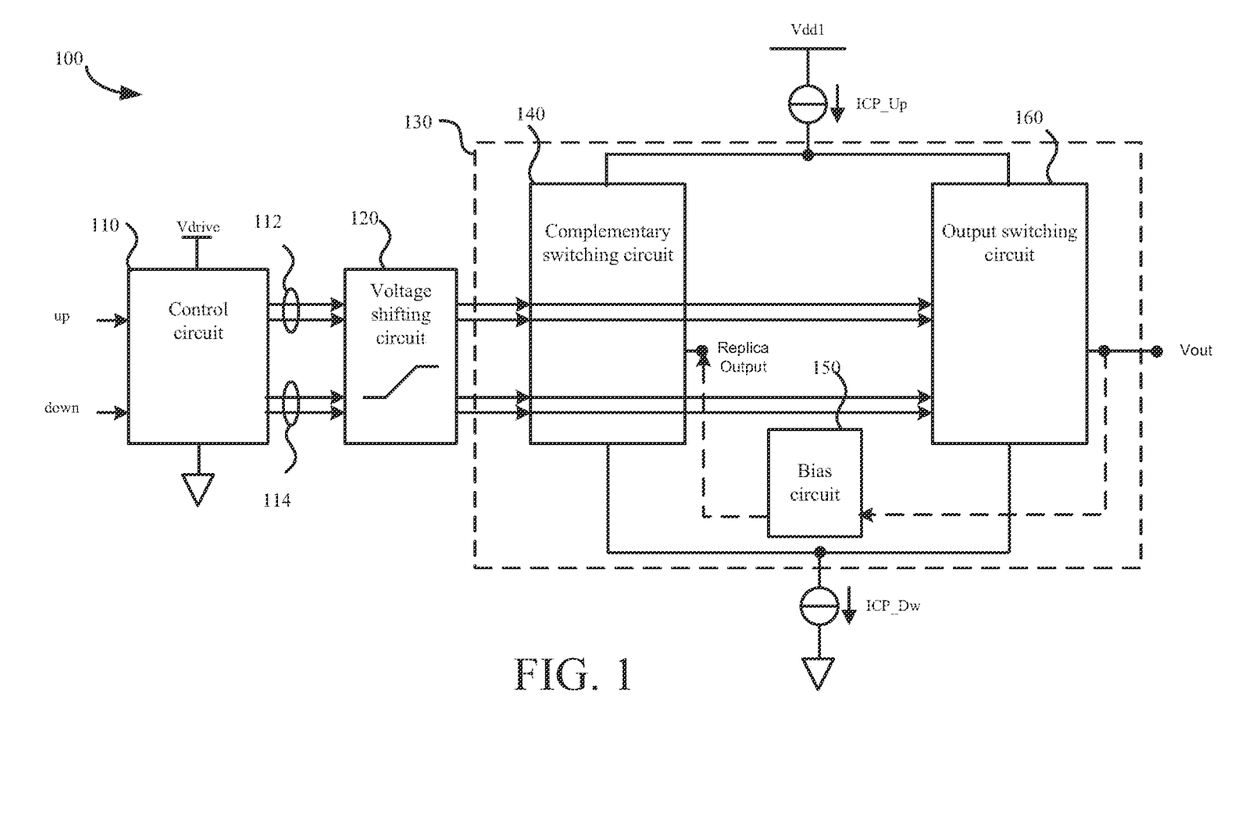
FIG. 1 shows a first charge pump circuit with level shifting, in accordance with one or more embodiments of the present disclosure.

Turning now to the figures, FIG. 1 shows a first charge pump circuit with level shifting, in accordance with one or more embodiments of the present disclosure. The charge pump circuit 100 includes an adjustment circuit 130 configured and arranged to adjust a voltage of an output (Vout) in response to first and second sets of control signals 112 and 114. The first and second sets of control signals 112 and 114 are generated by a control circuit 110 in response to first and second command signals (up and down). The adjustment circuit 130 is powered by a first supply voltage (Vdd1). The control circuit 110 is powered by a second voltage (Vdrive) that is less than the first supply voltage (Vdd1). The voltages used for Vdd1 and Vdrive may depend on the application. For instance, in one application, Vdd1 is equal to 3.3. volts and Vdrive is equal to 1.8 volts. In another application, Vdd1 is equal to 5.0 volts and Vdrive is equal to 3.3 volts. Other voltages may be used as well, depending on the application.

The adjustment circuit 130 includes a set of transistors having respective switching voltages. Due to changes in the output voltage (Vout) during operation, switching voltages of the transistors may migrate. For instance, for an NMOS transistor having a source terminal connected to the output, the switching voltage required to turn on the NMOS will vary depending on Vout (e.g., Vout+Vgs_on). Due to such migration of the switching voltages, the control signals may not sufficiently align with the switching voltages of the transistors driven by the control signals. As a result, on and off switching voltages of transistors may vary over time and will not be the same for all transistors, leading to chargedump. The charge pump circuit 100 includes a voltage shifting circuit 120 to improve alignment of the control signals with the switching threshold parameters of the transistors of the adjustment circuit 130. The voltage shifting circuit 120 biases voltages of the first and second sets of control signals relative to the output voltage and switching threshold parameters of the transistors. For instance, in some embodiments, the voltage shifting circuit 120 biases each control signal to track with the migration of a switching voltage of a transistors driven by the control signal. The voltage shifting circuit 120 may bias each control signal to center an operating voltage range of the control signal relative to the on and off switching voltages of a transistor.

The adjustment circuit 130 may be implemented using various circuits. In one possible implementation, the adjustment circuit 130 includes an output switching circuit 160, a complimentary switching circuit 140, and a bias circuit 150. The output switching circuit 160 is configured to adjust a voltage of an output terminal of the charge pump circuit 100, in response to the first and second sets of control signals 112 and 114 provided by the control circuit, via the voltage shifting circuit 120. For instance, the output switching circuit 160 may increase a voltage of the output terminal by connecting the output terminal to a first current supply configured to provide current to the output terminal. Conversely, the output switching circuit 160 may decrease a voltage of the output terminal by connecting the output terminal to a second current supply configured to drain current from the output terminal.

The complementary switching circuit 140 improves performance by performing switching operations which are complementary to the switching operations performed by output switching circuit 160. For instance, the complementary switching circuit 140 may be configured to connect a replica output node to the first current supply when the output switching circuit 160 disconnects the output Vout from the first current supply. Conversely, the complementary switching circuit 140 may disconnect the replica output from the first current supply in response to the output switching circuit 160 connecting the output Vout to the first current supply. To enable the complementary operation of the complementary switching circuit, bias circuit 150 provides the Vout voltage to the replica output node. The bias circuit may be implemented, for example, by a unity gain buffer. Alternatively, other circuits may be used to provide the replica voltage to the replica output.

The complementary switching circuit 140 and the bias circuit 150 are operated to keep the output switching circuit 160 in equivalent conditions during on and off switching, in order to provide output pulses to the output with an accurately defined charge (I*Δt) that is linearly dependent on pulse duration Δt and independent of Vout and the number of transitions.

Figure 2:
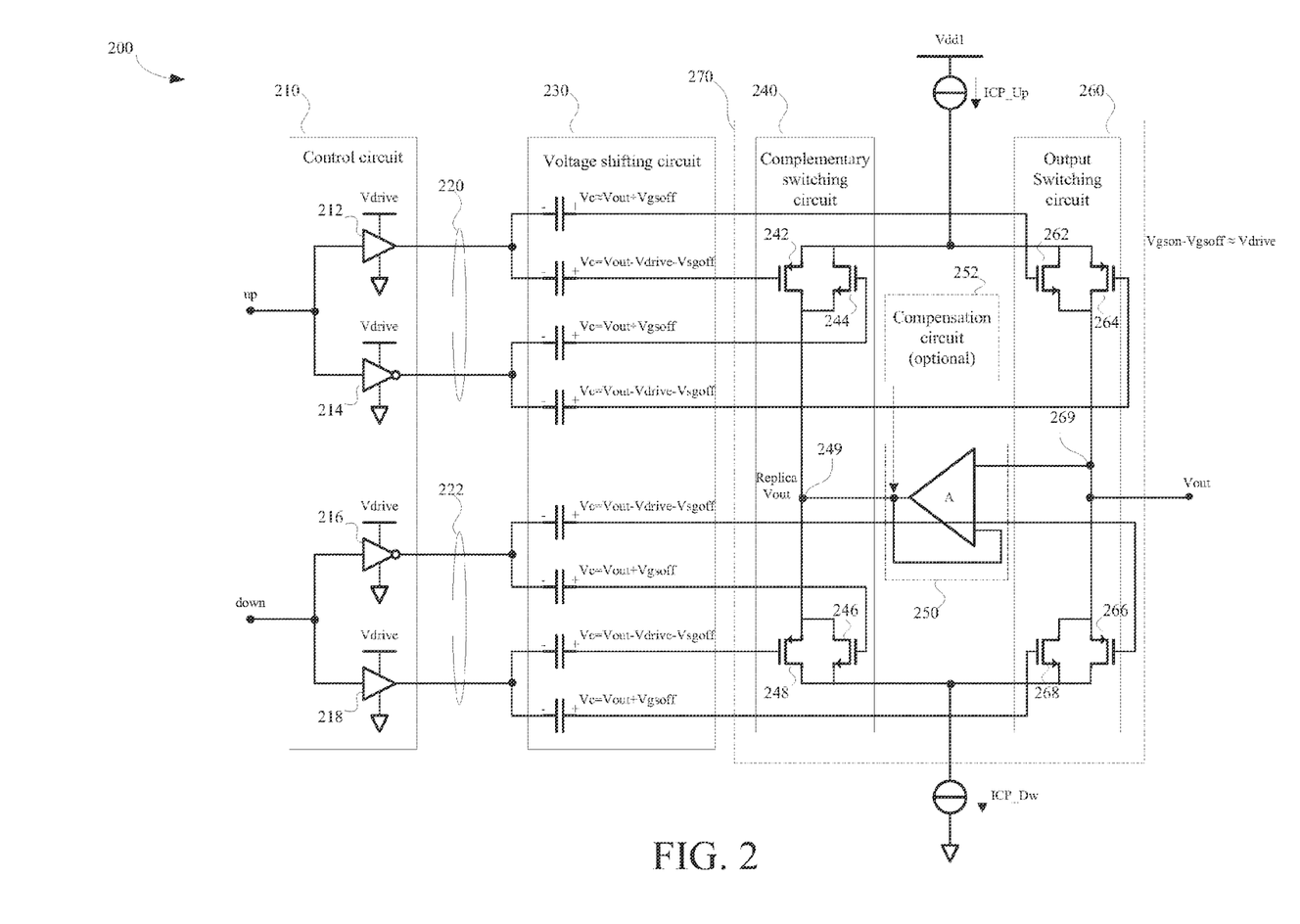
FIG. 2 shows a second charge pump circuit with level shifting, in accordance with one or more embodiments of the present disclosure.

FIG. 2 shows a second charge pump circuit with level shifting, in accordance with one or more embodiments of the present disclosure. Similar to the charge pump circuit shown in FIG. 1, the charge pump circuit 200, includes an adjustment circuit 270 configured and arranged to adjust a voltage of an output (Vout) in response to first and second sets of control signals 220 and 222, which are generated by a control circuit 210.

In this example, the adjustment circuit 270 includes an output switching circuit 260, a bias circuit 250, and a complimentary switching circuit 240. The complementary and output switching circuits 240 and 260 are configured to adjust voltages of respective output nodes 249 and 269 in response to the first and second sets of control signals 220 and 222 generated by the control circuit 210. The bias circuit 250 provides a replica voltage signal, which is approximately equal to Vout, to output node 249. In the example shown in FIG. 2, the bias circuit 250 is implemented by a unity gain buffer having an input coupled to the output node 269 and an output coupled to output node 249. Alternatively, other circuits may be used to provide the replica voltage to the output node 249. In some implementations, the bias circuit 250 may consume excess current while driving the output node 249 toward the output voltage Vout. For instance, current provided by the complementary switching circuit 240 to the output node 249 may be consumed by the bias circuit 250 in an attempt to maintain the output node 249 at the output voltage Vout. In some implementations, power consumption of the bias circuit 250 may be reduced by a compensation circuit 252 which injects a complementary current to that provided to the output node 249 by the complementary switching circuit 240.

The output switching circuit 260 includes a pull-up circuit (transistors 262 and 264) configured to connect/disconnect the corresponding output node 269 to/from a pull-up current source (ICP_Up), as directed by the first set of control signals. The output switching circuit 260 also includes a pull-down circuit (transistors 266 and 268) configured to connect/disconnect the corresponding output node 269 to/from a pull-down current source (ICP_Dw), as directed by the second set of control signals. Similarly, complementary switch circuit 240 includes a pull-up circuit (transistors 242 and 244) configured to connect/disconnect the corresponding output node 249 to/from the current source (ICP_Up), as directed by the first set of control signals. The complementary switching circuit 240 also includes a pull-down circuit (transistors 246 and 248) configured to connect/disconnect the corresponding output node 249 to/from the current source (ICP_Dw), as directed by the second set of control signals.

As described with reference to the complementary switching circuit 140 in FIG. 1, the complementary switching circuit 240 is configured to perform switching operations that are complementary to those performed by the output switching circuit 260. In the embodiment shown in FIG. 2, the complementary behavior of the complementary switching circuit 240 is achieved by implementing the complementary switching circuit 240 and the output switching circuit 260 using identical circuits with the same types of transistors but driven by complementary sets of control signals. For instance, if a binary control signal having a logical 1 value is provided to the output switching circuit 260 a binary control signal having the complementary value (i.e., logical 0) is provided to the complementary switching circuit 240.

In the example shown in FIG. 2, the pull-up and pull-down circuits are implemented using complementary pairs of p-type and n-type transistors. However, in some embodiments other circuits may be used to implement the pull-up and pull-down circuits (e.g., a single transistor for each pull-up or pull-down circuit). The first and second sets of signals generated by the control circuit 210 include two complementary signals to drive each of the complementary pairs. The control circuit 210 includes a driver 212 and an inverter 214 that provide two complementary values (UP and ~UP) as the first set of control signals. The control circuit 210 also includes a driver 216 and an inverter 218 that provide two complementary values (DOWN and ~DOWN) as the second set of control signals.

The drivers 212 and 216 and the inverters 214 and 218 of control circuit 210 are powered by a second voltage Vdrive. Vdrive controls the swing in the drivers and inverters 212, 214, 216, and 218. The Vdrive voltage may be set so transistors of switching circuits 240 and 260 can be just sufficiently turned on and off by the first and second sets of control signals. In some embodiments Vdrive may be provided by a second supply voltage (Vdd2) that is lower that the first supply voltage. In some embodiments, Vdrive may be set so the voltage swing of each of the first and second sets of control signals is approximately equal to the difference between the on and off switching voltages of the corresponding transistor.

As indicated above, switching voltages of transistors of the complementary and output switching circuits 240 and 260 may drift in response to changes in the output voltage Vout. To compensate for such migration, the charge pump circuit 200 includes a voltage shifting circuit 230 to improve alignment of the control signals 220 and 222 with the switching voltages of the transistors 242, 244, 246, 248, 262, 264, 266 and 268 of the complementary and output switching circuits 240 and 260. The voltage shifting circuit 230 biases voltages of the first and second sets of control signals 220 and 222, relative to the output voltage (Vout) and the respective switching threshold parameters (e.g., Vgs_on and Vgsoff) of the transistors. In the example shown in FIG. 2, the voltage shift performed by the voltage shifting circuit for each control signal is depicted as a voltage across a capacitor.

In some embodiments, the voltage shifting circuit 230 biases each control signal to center an operating voltage range of the control signal relative to the respective switching threshold parameters and the output voltage Vout. In some specific implementations, the voltage shifting circuit 230 may bias control signals provided to n-type transistors by a voltage Vc1, approximately equal to Vout+Vgsoff. The voltage shifting circuit 230 also biases control signals provided to p-type transistors by a voltage Vc2, approximately equal to Vout−Vdrive−Vsgoff. A skilled artisan will appreciate that the voltage shifting circuit may in the alternative perform voltage shifts as a function of the Vout and various other switching threshold parameters. For instance voltage shifts may be performed as a function of Vout and the switching threshold parameter Vt, which indicates a voltage difference between the source-gate voltages at which a transistor turns on and off.

Some embodiments may bias the control signals by other amounts. For instance, in some implementations, the voltage shifting circuit may bias control signals provided to p-type transistors by an amount (Vshift) in a first range, where Vout+Vdrive−Vt>Vshift>Vout−Vt. Similarly, the voltage shifting circuit may bias control signals provided to n-type transistors by an amount (Vshift) in a second range, where Vout+Vt−Vdrive<Vshift<Vout+Vt.

Figure 3:
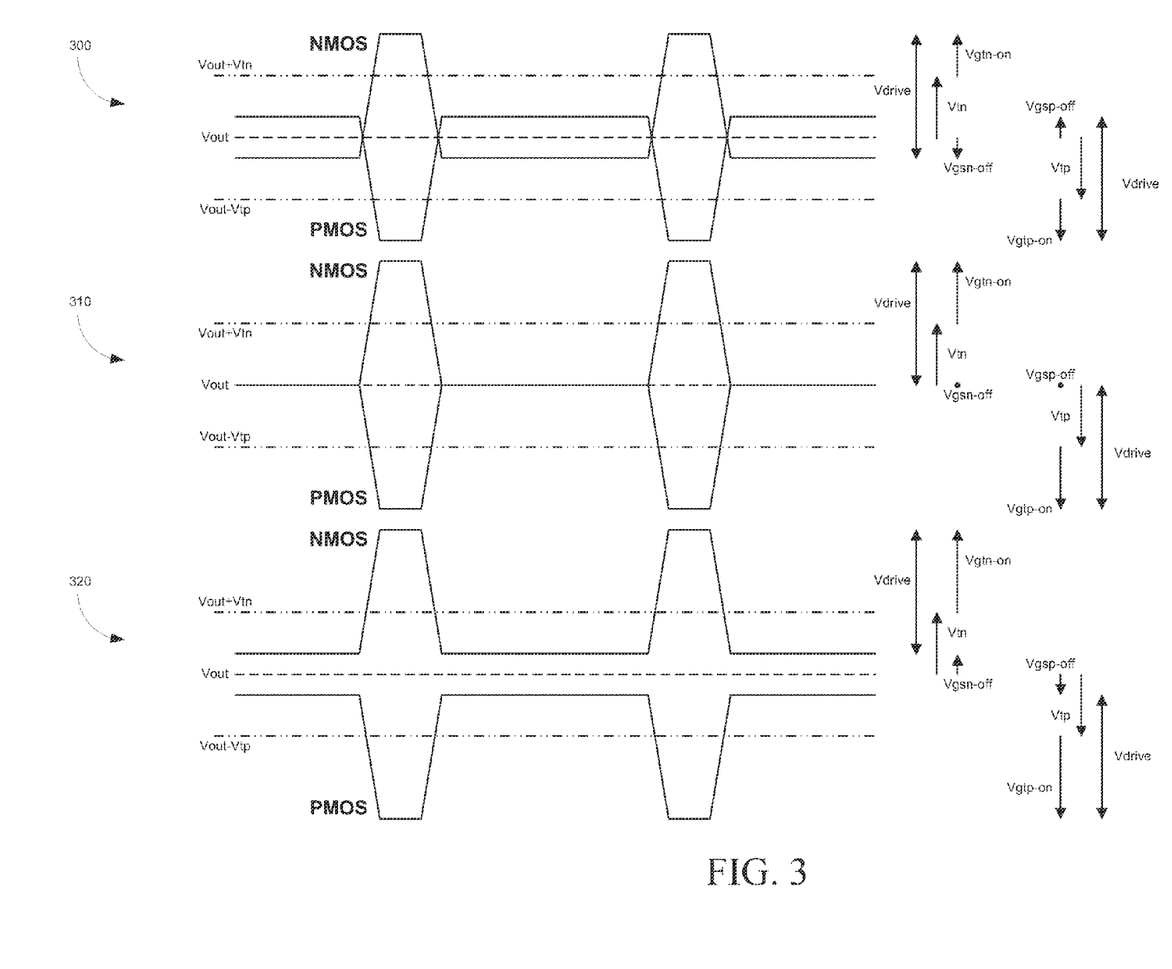
FIG. 3 illustrates on and off switching voltages of transistors for different levels of voltage biasing.

FIG. 3 illustrates on and off switching voltages of PMOS and NMOS transistors for three levels of voltage biasing. Each level of voltage biasing is depicted in a respective waveform diagram 300, 310, or 320. Each waveform diagram 300, 310 and 320 shows a first threshold voltage (Vout−Vtp) for a PMOS transistor, a second threshold voltage (Vout+Vtn) for a NMOS transistor, and complementary control signals provided to the PMOS and NMOS transistors.

The difference between the waveforms in the diagrams is the actual off voltage of the transistors. In waveform diagram 310, this is zero, and the on voltage approaches Vdrive. In waveform diagram 300, the switches are turned off even more, but this comes at the cost of reduced on voltage, as the drive swing is a given. Conversely, waveform diagram 320 shows that the on voltage can be increased with respect to Vdrive by allowing an off voltage above zero.

Figure 4:
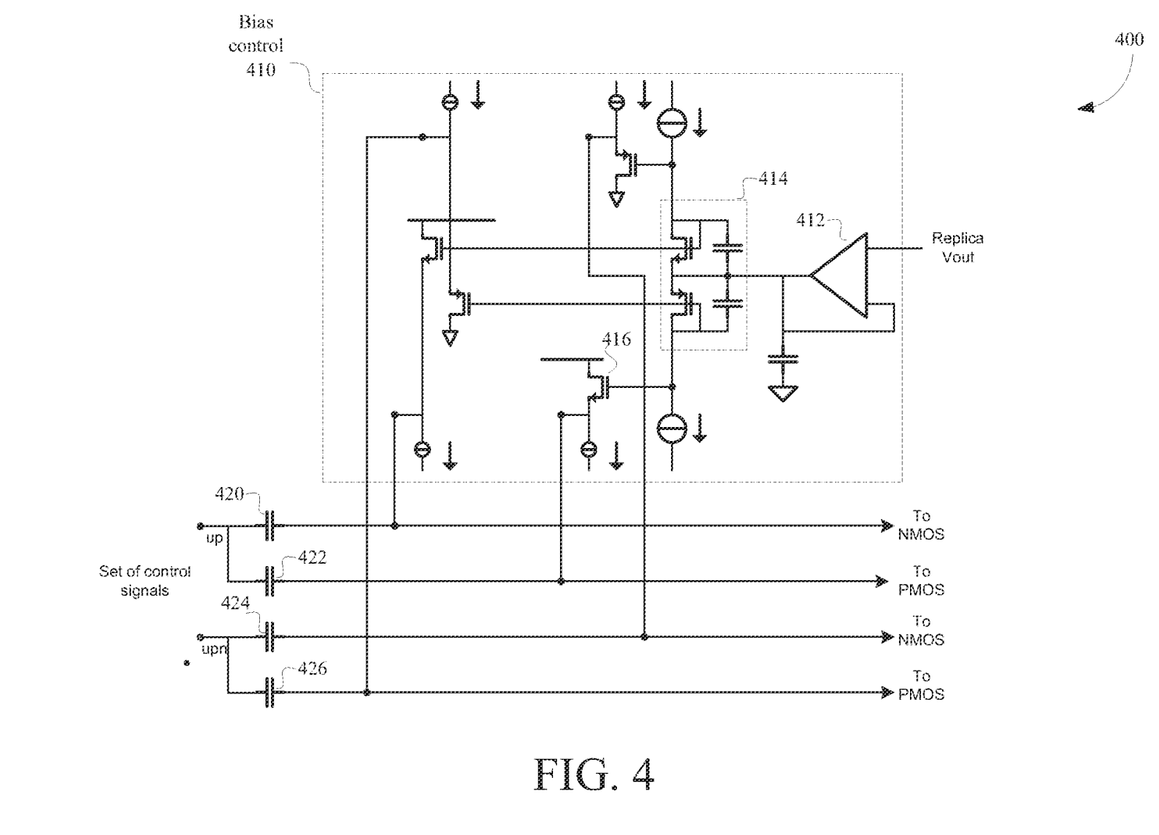
FIG. 4 shows a first circuit for voltage shifting one set of control signals, in accordance with one or more embodiments.

The voltage shifting circuit may be implemented differently in various embodiments. FIG. 4 shows a first circuit for voltage shifting one set of control signals, in accordance with one or more embodiments. The voltage shifting circuit 400 includes a respective capacitor 420, 422, 424 and 426 for each signal to be biased. Each capacitor allows the AC control signal, provided to an input side of the capacitor, to be biased by applying a DC voltage across the capacitor. The voltage shifting circuit also includes a bias control circuit 410 configured to apply an appropriate bias across each of the capacitors 420, 422, 424 and 426. In this example, bias control circuit 410 includes a buffer 412 configured to provide a replica output voltage to a diode stack 414. For each control signal, the bias control circuit 410 also includes a respective source-follower structure (e.g., 416), which attempts to pull the shifted voltages to a predetermined fixed level. Source-followers show a high output impedance if the signal changes in one direction and a low impedance if the signal changes in the other direction, thereby clipping the signal level to a fixed high (or low) limit level with respect to the output voltage (Vout). In this example, the choice for high and low level clipping is made such that the chargepump does not send charge to its output when there are no up or down pulses for a long period of time. Note that the difference between the high and low clipping levels is preferably made to match the signal swing Vdrive, such that switch gate drive symmetry is preserved.

Figure 5:
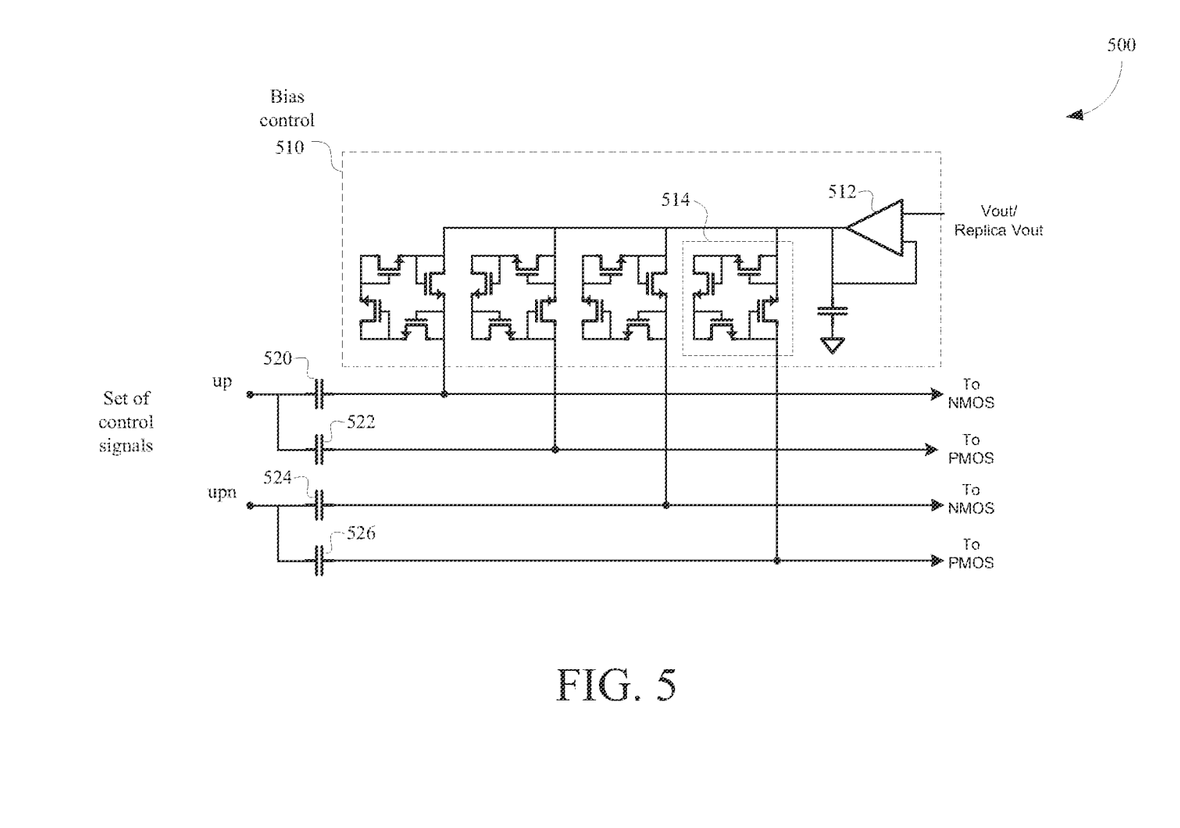
FIG. 5 shows a second circuit for voltage shifting one set of control signals, in accordance with one or more embodiments.

FIG. 5 shows a second circuit for voltage shifting one set of control signals in accordance with one or more embodiments. The voltage shifting circuit 500 includes a respective capacitor 520, 522, 524 and 526 for each signal to be biased. The voltage shifting circuit also includes a bias control circuit 510 configured to apply an appropriate bias across each of the capacitors 520, 522, 524 and 526. In this example, bias control circuit 510 includes a buffer 512 configured to provide a replica output voltage. For each control signal, the bias control circuit 510 also includes a respective set of diodes 514 configured to direct the nominal voltage of the control signals toward the intended on and off voltages of the corresponding transistors.

The disclosed embodiments are applicable to a variety of circuits and applications utilizing charge pumps. For instance, a charge pump configured in accordance with the disclosed embodiment may be used to reduce jitter in a phase-locked-loop (PLL) circuit. Phase-locked loops (PLL) are often used for frequency multiplication and/or phase alignment. One type of PLL utilizes a charge pump to convert logic control signals from a phase and/or frequency detector into charge-pulses for frequency control of a voltage control oscillator. The quality of the output clock provided by a PLL is affected by the accuracy of the charge pump. In some embodiments, an accurate PLL is implemented using a charge pump configured in accordance with the charge pumps disclosed herein.

Figure 6:
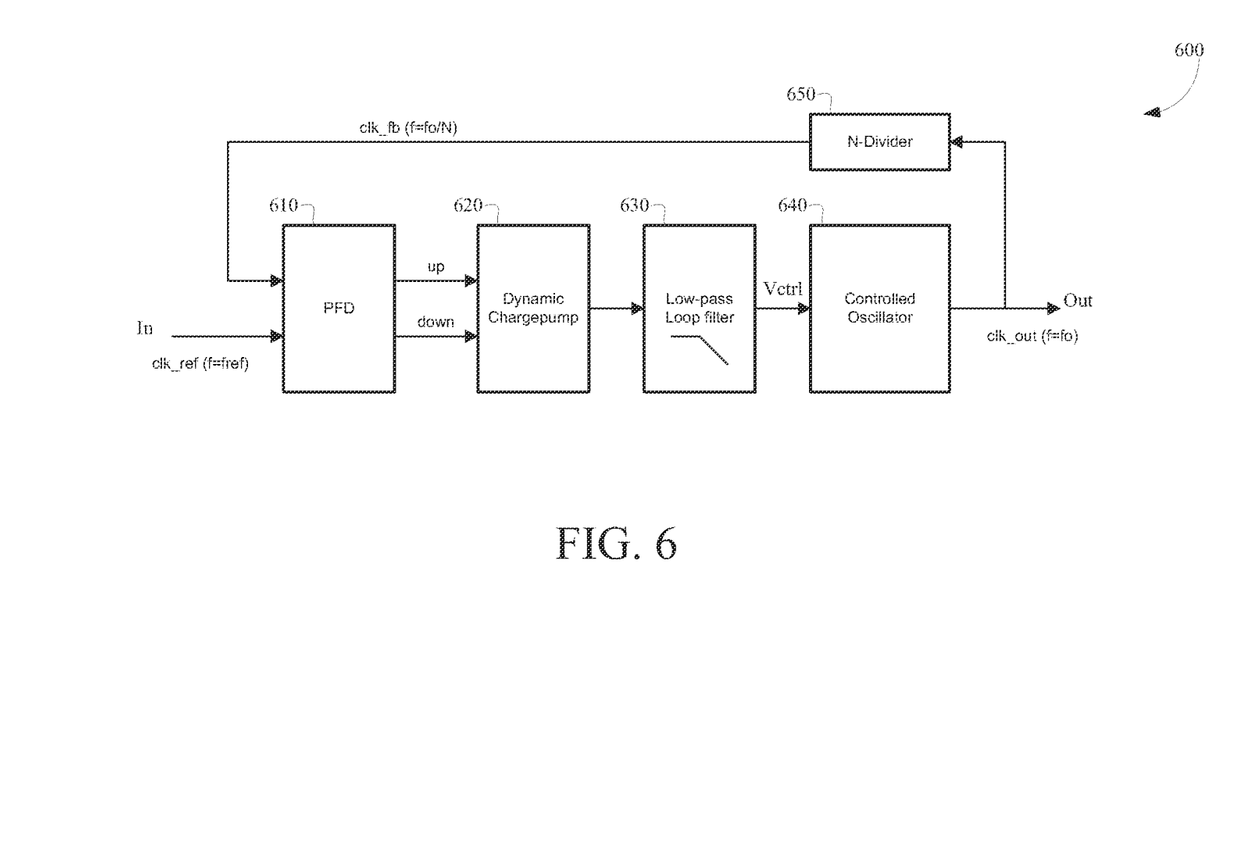
FIG. 6 shows a phase-lock-loop (PLL) circuit having a charge pump configured and arranged in accordance with one or more embodiments.

FIG. 6 shows a phase-lock-loop (PLL) circuit 600 having a charge pump configured and arranged in accordance with one or more embodiments. The PLL circuit 600 compares the phase of an input signal (In) with the phase of a feedback signal and adjusts an oscillation frequency of a voltage controlled oscillator 640 to keep the phases matched. In some embodiments, in which the PLL circuit is used for frequency multiplication, the feedback signal may be provided by a frequency divider 650 that divides the output signal by the multiplier N. A phase frequency detector (PFD) 610 provides command signals (UP/DOWN) to adjust frequency of the output signal based on a comparison of phases of the input and feedback signals. The command signals (UP/DOWN) of the PFD 610 are integrated by a charge pump 620 and a loop filter 630 to provide a voltage signal (Vct to set the oscillating frequency of the voltage controlled oscillator 640. For instance, the UP signal may be set to direct the charge pump to increase the voltage Vctrl, thereby directing the voltage controlled oscillator 640 to increase the operating frequency of the signal output by the PLL circuit 600. Conversely, the DOWN signal may be set to direct the charge pump to decrease the voltage Vctrl, thereby directing the voltage controlled oscillator 640 to decrease the operating frequency of the signal output by the PLL circuit 600.

Different embodiments may utilize various p-type and n-type transistors having respective gate dimensions and characteristics. In some embodiments, different transistors may have different gate dimensions. In some other embodiments, p-type and n-type transistors have equal gate dimensions. In some implementations, where p-type and n-type transistors have equal gate dimensions, the control signals provided to the transistors are biased so that n-type and p-type transistors are driven equally below their threshold voltages (e.g., Vtn and Vtp) when turned off and driven equally above their threshold voltage when turned on. This may improve balance in charge distribution in the charge pump. It is not necessary that the drive levels used to turn the transistors on exceed the threshold voltages by the same amount as the drive levels used to turn the transistors off.

In one exemplary embodiment consistent with one or more of the above-discussed charge pump circuits, each of the first and second switching circuits can include a set of P-type transistors having respective gates driven by respective ones of the first and second sets of control signals, and a set of N-type transistors having respective gates driven by respective ones of the first and second sets of control signals, with P-type transistors having gate dimensions that are the same as the gate dimensions of the N-type transistors. The biasing circuit for these transistors is configured and arranged to bias the first and second sets of control signals by voltages to achieve that the capacitive charge transfer to the output due to switching between on and off state cancels out for N-type and P-type transistors. If for a certain technology the parasitic capacitances of P-type and N-type transistors would be significantly different for the same dimensions, the dimension could be chosen different to achieve similar capacitances.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities. For example, in certain of the above-discussed embodiments, one or more block circuits are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having instructions stored therein which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For instance, though aspects and features may in some cases be described in individual figures, it will be appreciated that features from one figure can be combined with features of another figure, even though the combination is not explicitly shown or explicitly described as a combination. Such modifications do not depart from the true spirit and scope of various aspects of the disclosure, including aspects set forth in the claims.

What is claimed is:

1. A charge pump circuit, comprising:
   a first circuit powered by a first supply voltage and configured and arranged to adjust a voltage of an output in response to first and second sets of control signals, the first circuit including a set of transistors having respective switching voltages;
   a control circuit powered by a second voltage that is less than the first supply voltage, the control circuit configured and arranged to generate the first set of control signals as a function of a voltage of a first command signal and generate the second set of control signals as a function of a voltage of a second command signal; and
   a voltage shifting circuit configured and arranged to bias voltages of the first and second sets of control signals relative to the switching voltages;
   wherein the first circuit includes:
      first and second switching circuits, each configured and arranged to adjust voltage of a respective output node in response to the first and second sets of control signals, wherein the output node of the first switching circuit is connected to the output; and
      a unity gain buffer configured and arranged to bias a voltage of the output node of the second switching circuit toward a voltage of the output node of the first switching circuit; and
   further comprising a compensation circuit configured and arranged to reduce power consumption of the unity gain buffer by injecting a compensation signal into the respective output node of the second switching circuit, the compensation signal having a current that is complementary to a current provided to the respective output node by the second switching circuit.

2. The charge pump circuit of claim 1, wherein for each of the first and second sets of control signals, the voltage shifting circuit:
   biases the control signal to center an operating voltage range of the control signals relative to on and off switching voltages of a respective one of the set of transistors, thereby compensating for drift of the switching voltages induced by changes to the voltage of the output; and
   provides the biased control signal to a gate terminal of the respective one of the set of transistors.

3. The charge pump circuit of claim 1, wherein:
   each of the set of transistors has a gate driven by a respective one of the first and second sets of control signals; and
   for each of the set transistors, the voltage shifting circuit is configured and arranged to bias a voltage of the corresponding control signal used to drive the gate of the transistor, based on a switching voltage of the transistor.

4. The charge pump circuit of claim 3, wherein:
   for each of the set of transistors that is an n-type transistor, the voltage shifting circuit increases a voltage of the corresponding control signal used to drive a gate of the transistor by an amount equal to the voltage of the output and a gate-source voltage at which the n-type transistor is turned off; and
   for each of the set of transistors that is a p-type transistor, the voltage shifting circuit increases a voltage of the corresponding control signal used to drive the gate of the transistor by an amount equal to the voltage of the output, less the second voltage and less a source-gate voltage at which the p-type transistor is turned off.

5. The charge pump circuit of claim 1, wherein:
   each of the set of transistors has switching voltages that drift in response to changes in the voltage of the respective output node; and
   the voltage shifting circuit is further configured and arranged to bias voltages of the first and second sets of control signals to follow the drift of the switching voltages of the set of transistors.

6. The charge pump circuit of claim 1, wherein the voltage shifting circuit includes:
   a set of capacitors, each having a respective first terminal coupled to receive a respective one of the first and second sets of control signals generated by the control signal, and a second terminal coupled to provide the respective one of the first and second sets of control signals to the first and second switching circuits; and
   a biasing circuit configured and arranged to bias the first and second sets of control signals, provided to the first and second switching circuits, by adjusting a respective charge on each capacitor of the set of capacitors.

7. The charge pump circuit of claim 6, wherein a difference between an on switching voltage and an off switching voltage of each of the set of transistors approaches to the second voltage.

8. The charge pump circuit of claim 1, including:
   first and second switching circuits including respective sets of transistors configured and arranged to provide current or charge to a respective output node in response to a first set of control signals, and drain current from the respective output node in response to a second set of control signals;

a bias circuit configured and arranged to bias a voltage of the output node of the second switching circuit toward a voltage of the output node of the first switching circuit;

a control circuit, the control circuit having first and second control inputs and configured and arranged to generate the first set of control signals as a function of a voltage of the first control input, and generate the second set of control signals as a function of a voltage of the second control input; and a voltage shifting circuit configured and arranged to bias voltages of the first and second sets of control signals as a function of the voltage of the output node of the first switching circuit, thereby compensating for migration of switching voltages of the respective sets of transistors.

9. The charge pump circuit of claim 8, wherein:

each transistor of the respective sets of transistors has a gate driven by a respective one of the first and second sets of control signals; and for each transistor of the respective sets of transistors, the voltage shifting circuit is configured and arranged to bias a voltage of the corresponding control signal used to drive the gate of the transistor, based on a switching voltage of the transistor.

10. The charge pump circuit of claim 9, wherein:

for each transistor of the respective sets of transistors that is an n-type transistor, the voltage shifting circuit increases a voltage of the corresponding control signal used to drive a gate of the transistor by an amount equal to the voltage of the output and a gate-source voltage of the n-type transistor at which it is turned off; and for each transistor of the respective sets of transistors that is a p-type transistor, the voltage shifting circuit increases a voltage of the corresponding control signal used to drive the gate of the transistor by an amount equal to the voltage of the output, less the second voltage and less an source-gate voltage of the p-type transistor at which it is turned off.

11. The charge pump circuit of claim 9, wherein the voltage shifting circuit includes:

a set of capacitors, each having a respective first terminal coupled to receive a respective one of the first and second sets of control signals generated by the control signal, and a second terminal coupled to provide the respective one of the first and second sets of control signals to the first and second switching circuits; and a biasing circuit configured and arranged to bias the first and second sets of control signals, provided to the first and second switching circuits, by adjust a respective charge on each capacitor of the set of capacitors.

12. The charge pump circuit of claim 11, wherein:

the first and second switching circuits each include a set of P-type transistors, having respective gates driven by respective ones of the first and second sets of control signals, and a set of N-type transistors, having respective gates driven by respective ones of the first and second sets of control signals;

the set of P-type transistors have gate dimensions that are the same as gate dimensions of the set of N-type transistors; and the biasing circuit is configured and arranged to bias the first and second sets of control signals by voltages to achieve that the capacitive charge transfer to the output due to switching between on and off state cancels out for the N-type and P-type transistors.

13. The charge pump circuit of claim 8, wherein the first set of control signals includes a first subset of control signals provided to the first switching circuit and a second subset of control signals provided to the second switching circuit, the second subset of control signals having values that are the complement of values of the first subset of control signals; and the second set of control signals includes a first subset of control signals provided to the first switching circuit and a second subset of control signals provided to the second switching circuit, the second subset of control signals having values that are the complement of values of the first subset of control signals.

14. The charge pump circuit of claim 8, wherein each of the first and second switching circuits includes:

a pull-up transistor switch configured and arranged to provide current from a first current source to the respective output node, in response to the first set of control signals; and a pull-down switch configured and arranged to provide current from the respective output node to a second current source, in response to the second set of control signals.

15. The charge pump circuit of claim 14, wherein:

the pull-up and pull-down transistor switches of the first and second switching circuits have threshold switching voltages that drift in response to changes in the voltage of the respective output node; and the voltage shifting circuit is further configured and arranged to bias voltages of the first and second sets of control signals to follow the drift of the threshold switching voltages of the pull-up and pull-down transistor switches of the first and second switching circuits.

16. The charge pump circuit of claim 1, including a phase-lock-loop (PLL) circuit, including:

a phase frequency detection (PFD) circuit configured and arranged to provide command signals, based on a comparison of phases of an input signal and a feedback signal, for adjustment of a frequency of an output signal;

a charge pump circuit configured and arranged to receive the command signals from the PFD circuit and adjust voltage of a frequency control signal based on the command signals, the charge pump circuit including:

a first circuit powered by a first supply voltage and configured and arranged to adjust a voltage of the frequency control signal in response to first and second sets of control signals, the first circuit including a set of transistors having respective switching voltages;

a control circuit powered by a second voltage that is less than the first supply voltage, the control circuit configured and arranged to generate the first set of control signals as a function of a first one of the command signals and generate the second set of control signals as a function of a voltage of a second one of the command signals; and a voltage shifting circuit configured and arranged to bias voltages of the first and second sets of control signals relative to the respective switching voltages;

a voltage controlled oscillator having an input coupled to receive the control signal from the charge pump circuit and configured and arranged to generate the output signal; and a feedback path configured and arranged to derive the feedback signal from the output signal and provide the feedback signal to the PFD circuit.

17. The PLL circuit of claim 16, wherein the phase frequency detection circuit is powered by the second voltage.

18. The PLL circuit of claim 16, wherein the voltage shifting circuit is configured and arranged to, for each of the first and second sets of control signals:
  bias the control signal to center an operating voltage range of the control signal relative to on and off switching voltages of a respective one of the set of transistors, thereby compensating for drift of the switching voltages induced by changes to the voltage of the output; and
  provide the biased control signal to a gate terminal of the respective one of the set of transistors.

\* \* \* \* \*